(12) United States Patent
Park et al.

(10) Patent No.: US 8,552,302 B2
(45) Date of Patent: Oct. 8, 2013

(54) EMBEDDED CIRCUIT BOARD AND MANUFACTURING METHOD THEREOF

(75) Inventors: Kyung-Wan Park, Gyeonggi-do (KR); Shi-Yun Cho, Gyeonggi-do (KR); Byung-Jik Kim, Gyeonggi-do (KR); Ho-Seong Seo, Gyeonggi-do (KR); Youn-Ho Choi, Seoul (KR); Yu-Su Kim, Gyeonggi-do (KR); Seok-Myong Kang, Gyeonggi-do (KR); Ji-Hyun Jung, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 413 days.

(21) Appl. No.: 12/974,763

(22) Filed: Dec. 21, 2010

(65) Prior Publication Data
US 2011/0155426 A1    Jun. 30, 2011

(30) Foreign Application Priority Data

Dec. 24, 2009    (KR) ................. 10-2009-0131024

(51) Int. Cl.
*H05K 1/03* (2006.01)

(52) U.S. Cl.
USPC .......................................... 174/255

(58) Field of Classification Search
USPC ......... 174/250, 252, 255, 257, 259, 260, 262, 174/264, 266; 361/761, 762, 764, 765
See application file for complete search history.

(56) References Cited

U.S. PATENT DOCUMENTS

| | | | |
|---|---|---|---|
| 2008/0123308 A1* | 5/2008 | Ryu et al. | 361/762 |
| 2009/0139753 A1* | 6/2009 | Kim et al. | 174/257 |
| 2010/0078204 A1* | 4/2010 | We et al. | 174/260 |

* cited by examiner

*Primary Examiner* — Jeremy Norris
*Assistant Examiner* — Tremesha S Willis
(74) *Attorney, Agent, or Firm* — The Farrell Law Firm, P.C.

(57) ABSTRACT

An embedded circuit board is disclosed including a first copper clad laminate formed with a plurality of cavities and including a plurality of chips having different thicknesses embedded in the cavities, a second copper clad laminate provided in the cavities to allow the first copper clad laminate to level with the chips; and a resin coated copper foil provided on upper surfaces of the first and second copper clad laminates.

7 Claims, 4 Drawing Sheets

EMBEDDED CIRCUIT BOARD AND MANUFACTURING METHOD THEREOF

PRIORITY

This application claims priority under 35 U.S.C. §119(a) to an application entitled "Embedded Circuit Board And Manufacturing Method Thereof" filed in the Korean Industrial Property Office on Dec. 24, 2009, and assigned Serial No. 10-2009-0131024, the contents of which are incorporated herein by reference.

BACKGROUND OF THE INVENTION

1. Field of the Invention

The present invention relates to an embedded circuit board having chips of different thicknesses embedded in a first Copper Clad Laminate (CCL), and a second CCL is provided to allow the chips to level with the first CCL, and a manufacturing method thereof.

2. Description of the Related Art

In general, as electronic products become more highly functional, more lightweight and smaller in size, an increased mounting density is being regarded as an important factor.

With the tendency toward miniaturization, various technologies for mounting a larger number of packages on a board with a limited size have been developed and proposed, to improve mounting density of resistors, chips, Integrated Circuit (IC) parts and other components that are inserted onto the board.

In most cases, individual resistors, chips or ICs are mounted on the surface of a printed circuit board, with resistors and IC parts inserted into an inner layer of a board by using new material and processes to substitute for the role of passive and active parts of chips mounted on the surface of a board.

As shown in FIGS. 1 to 3, in a conventional embedded printed circuit board 1, a CCL 2 is formed with a cavity 4 into which IC parts 3 are inserted, a tape 5 is attached to one side of the CCL 2 to fix the IC parts 3, and the CCL 2 is turned over so that the IC parts 3 are pressed into the cavity 4.

In general, IC parts 3 having the same height as that of the cavity 4 are used. However, when the IC parts 3 having different thicknesses are embedded, as often required, Polypropylene Glycol (PPG) A1 is cut to an appropriate height and placed on the IC parts 3 having a thin thickness to level with the cavity 4, a Resin Coated Copper foil (RCC) 6 containing resin 6a is located on the CCL 2 for the lamination of another layer, and heat compression is performed, as shown in FIGS. 1 and 2.

However, as shown in FIGS. 2 and 3, in the conventional embedded printed circuit board 1, since the resin 6a contained in the RCC 6 flows out and fills the cavity 4 during a lamination process, the IC parts 3 eccentrically move from the initial position due to the resin 6a. Therefore, in the subsequent process, a via hole of the RCC 6 connected to a pad of the IC parts 3 is not exactly formed, causing a defect.

Furthermore, when heat is generated from the IC parts 3, additional components required to discharge the heat because the thickness of the IC parts 3 is thin, resulting in an increase in the manufacturing cost. In addition, it is necessary to provide a separate routing layer to perform an Electro Magnetic Interference (EMI) shield function.

In this regard, it is necessary to provide another CCL to prevent eccentric movement of chips by allowing resin to be uniformly introduced into the cavity in the CCL in the lamination process.

SUMMARY OF THE INVENTION

Accordingly, the present invention has been made to solve the above-mentioned problems occurring in conventional systems, and the present invention provides an embedded circuit board in which chips with different thicknesses are embedded in a CCL and another CCL is provided to allow the chips to level with the CCL, so that eccentric movement of the chips can be prevented by allowing resin to be uniformly introduced into a cavity in the CCL in a lamination process, and a manufacturing method thereof.

Also, the present invention provides an embedded circuit board in which chips with different thicknesses are embedded in a CCL, another CCL is provided to allow the chips to level with the CCL, and a plurality of via holes are formed through each CCL, so that heat discharge from the chips can be facilitated and the EMI shield function can be improved, and a manufacturing method thereof.

In accordance with an aspect of the present invention, there is provided an embedded circuit board including a first copper clad laminate formed with a plurality of cavities and including a plurality of chips having different thicknesses embedded in the cavities; a second copper clad laminate provided in the cavities to allow the first copper clad laminate to level with the chips; and a resin coated copper foil provided on upper surfaces of the first and second copper clad laminates.

In accordance with another aspect of the present invention, there is provided a method for manufacturing an embedded circuit board, including preparing a first copper clad laminate formed with a plurality of cavities; embedding a plurality of chips having different thicknesses in the cavities; providing an adhesive portion on upper surfaces of the chips having thickness smaller than a thickness of the first copper clad laminate; providing a second copper clad laminate on the chips, on which the adhesive portion is provided, to allow the first copper clad laminate to level with the chips; laminating a resin coated copper foil on upper surfaces of the first and second copper clad laminates; and performing a heat compression process with respect to the first and second copper clad laminates and the resin coated copper foil.

BRIEF DESCRIPTION OF THE DRAWINGS

The above and other aspects, features and advantages of the present invention will be more apparent from the following detailed description taken in conjunction with the accompanying drawings, in which.

DETAILED DESCRIPTION OF THE EMBODIMENTS OF THE INVENTION

Figure 1:
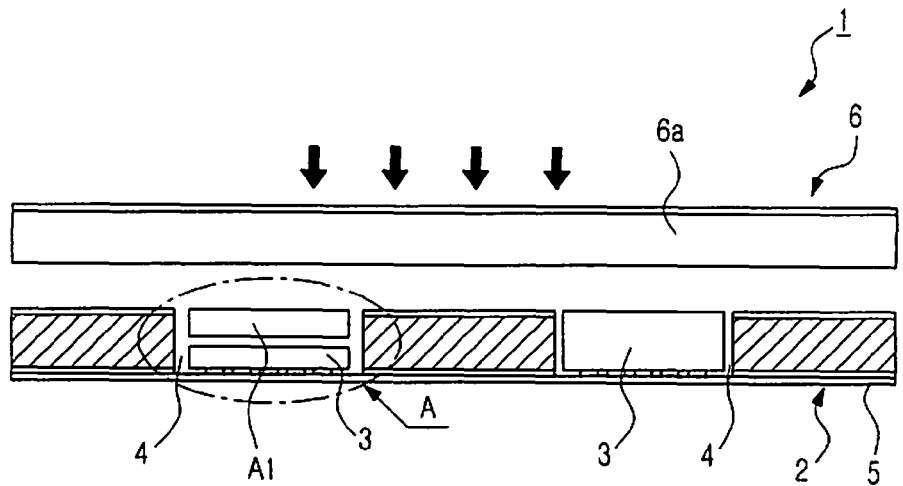
FIG. 1 is a diagram showing a manufacturing process of a conventional embedded circuit board.
Figure 2:
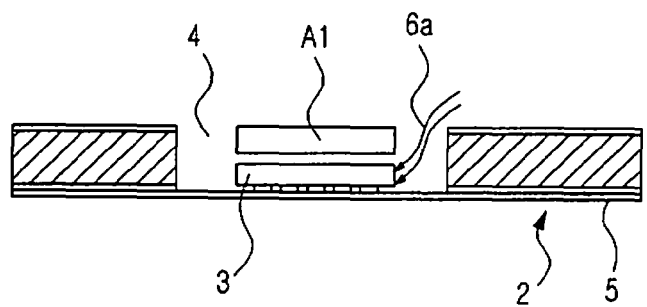
FIG. 2 is an enlarged view of section A shown in FIG. 1.
Figure 3:
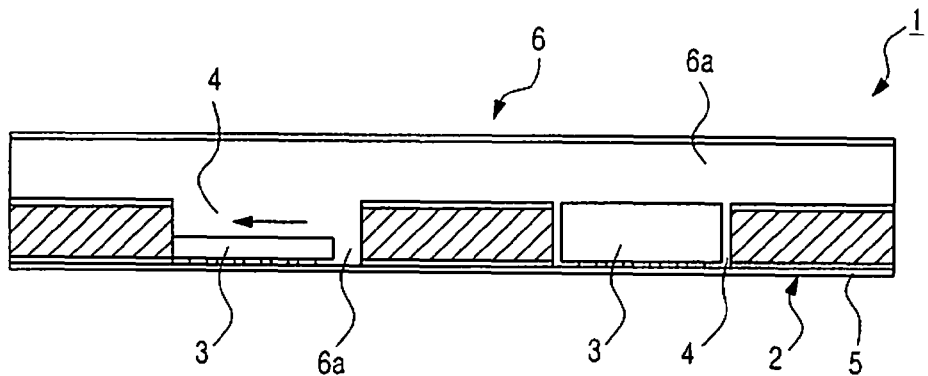
FIG. 3 is a diagram showing the configuration of a conventional embedded circuit board.

Hereinafter, embodiments of the present invention will be described with reference to the accompanying drawings. In the following description, the same elements will be designated by the same reference numerals although they are shown in different drawings. Further, various specific definitions found in the following description are provided only to help general understanding of the present invention, and it is apparent to those skilled in the art that the present invention can be implemented without such definitions.

As shown in FIGS. 4 to 7, an embedded circuit board 10 includes a first Copper Clad Laminate (CCL) 20 formed with a plurality of cavities 21, a second CCL 30, and a RCC 40 coated with resin 41. A plurality of chips 50 and 51 having different thicknesses are embedded in the cavities 21 of the first CCL 20, and a tape 70 is attached to rear surface of the first CCL 20 to support the chips 50 and 51. The second CCL 30 is provided in the cavities 21 to allow the first CCL 20 to level with the chips 51.

Figure 4:
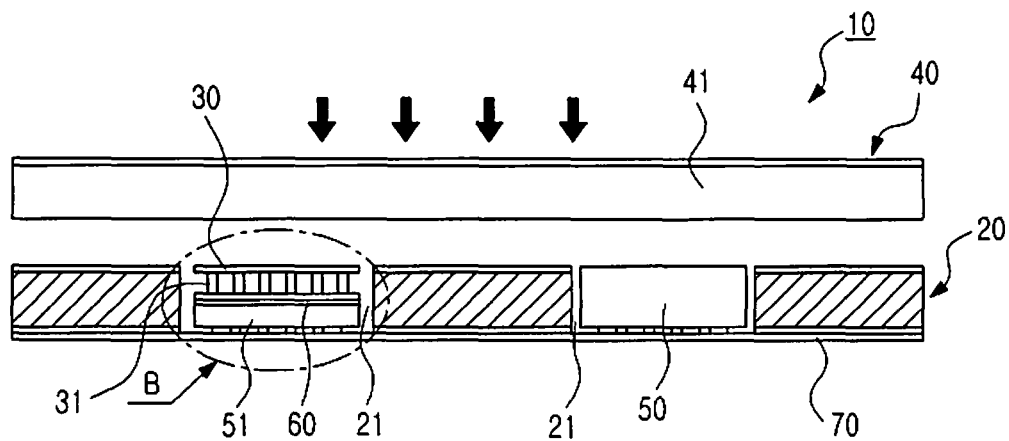
FIG. 4 is a diagram showing a manufacturing process of an embedded circuit board according to an embodiment of the present invention.
Figure 5:
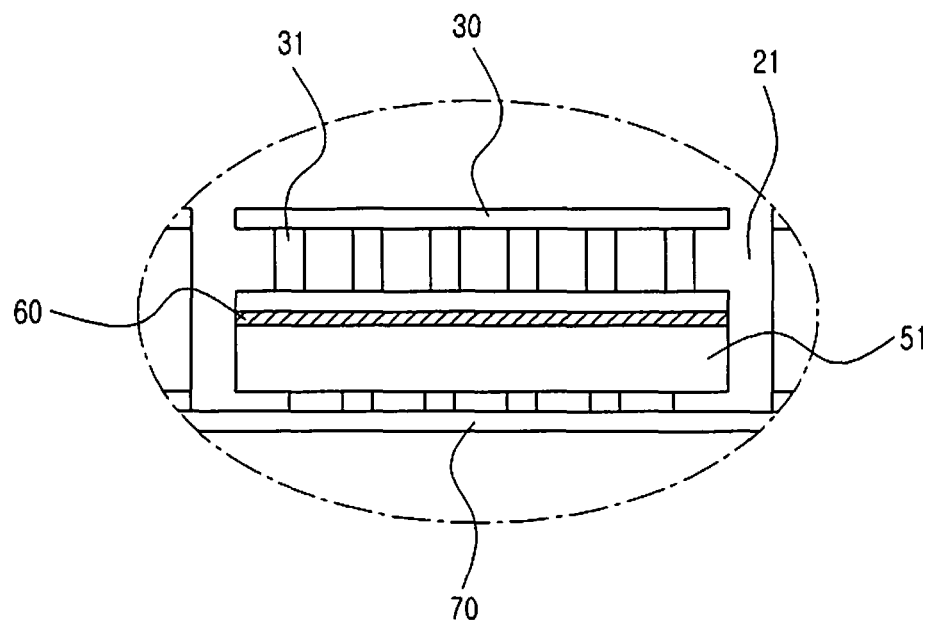
FIG. 5 is an enlarged view of section B shown in FIG. 4.

As shown in FIG. 4, the RCC 40 is provided on the upper surface of the first and second CCLs 20 and 30.

Figure 6:
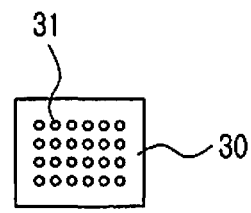
FIG. 6 is a diagram showing a second copper clad laminate of an embedded circuit board according to an embodiment of the present invention.
Figure 7:
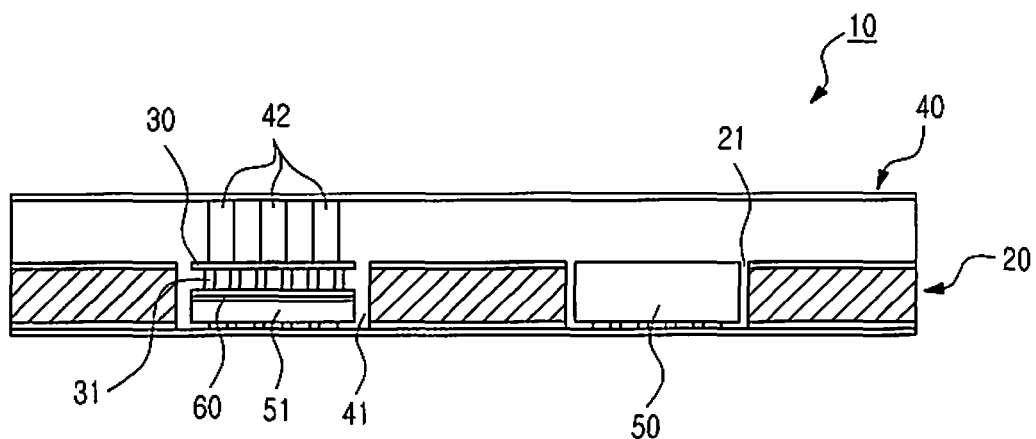
FIG. 7 is a diagram showing the configuration of an embedded circuit board according to an embodiment of the present invention.

As shown in FIGS. 6 and 7, the second CCL 30 is provided such that the resin 41 is uniformly introduced into the cavities 21 during the lamination process of the RCC 40 to prevent eccentric movement of the chips 51. An adhesive portion 60 is provided on upper surfaces of the chips 51 to adhere the chips 51 to the second CCL 30.

The adhesive portion 60 is formed of epoxy or attach film, and may be formed of another material.

As shown in FIGS. 4 to 7, the second CCL 30 is formed with a plurality of first via holes 31 to discharge heat generated by the chips 51. The RCC 40 is formed with a plurality of second via holes 42 such that the heat discharged through the first via holes 31 is discharged to the outside and the EMI shield function is performed.

The second via holes 42 include ground via holes.

The RCC 40 is subject to a heat compression process after a lamination process is performed with respect to the first and second CCLs 20 and 30.

The operation process of the embedded circuit board having the above configuration according to the preferred embodiment of the present invention will be described in more detail with reference to FIGS. 4 to 7.

As shown in FIGS. 4 to 7, the embedded circuit board 10 includes the first CCL 20 formed with the plurality of cavities 21, the second CCL 30, and the RCC 40 coated with the resin 41.

In such a state, the plurality of chips 50 and 51 having different thicknesses are embedded in the cavity 21.

The adhesive portion 60 is coated on the upper surfaces of the chips 51 having thicknesses smaller than that of the first CCL 20 in the cavity 21 of the first CCL 20 such that the chips 51 adhere to the second CCL 30.

As shown in FIGS. 4 to 7, the second CCL 30 adheres to the chip 51, on which the adhesive portion 60 is coated, to allow the chips 51 to a uniform level with the first CCL 20. The adhesive portion 60 is formed of epoxy or attach film, i.e. a Die Attach Film (DAE). The RCC 40 coated with the resin 41 is formed on upper surfaces of the first and second CCLs 20 and 30.

The resin 41 is introduced into the cavities 21 through the second CCL 30 by a constant amount, so that the eccentric movement of the chips 51 is prevented.

In such a state, the first and second CCLs 20 and 30 and the RCC 40 are subject to a heat compression process.

As shown in FIGS. 4 to 7, the second CCL 30 is formed with the plurality of first via holes 31 to discharge heat of the chips 51, and the RCC 40 is formed with the plurality of second via holes 42 to discharge the heat through the first via holes 31 to the outside and perform the EMI shield function with RCC 40 being covered by a copper foil coating on surfaces of first and second copper clad laminates thereof.

The second via holes 42 include ground via holes.

The manufacturing method of the embedded circuit board having the above configuration according to the preferred embodiment of the present invention will be described in more detail with reference to FIG. 8.

Figure 8:
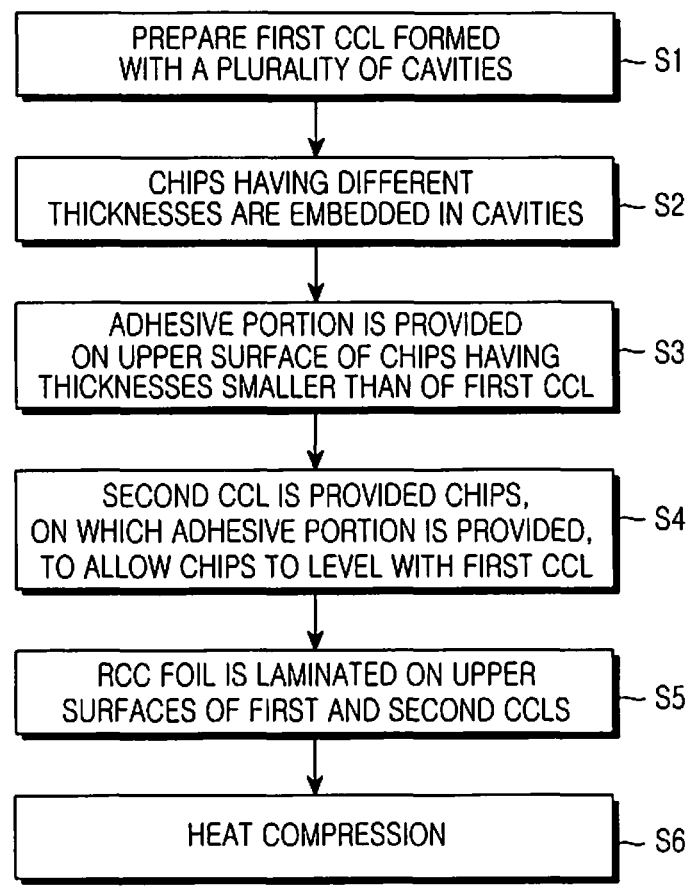
FIG. 8 is a flowchart explaining a method for manufacturing an embedded circuit board according to an embodiment of the present invention.

According to the manufacturing method of the embedded circuit board as shown in FIG. 8, the first CCL 20 formed with the plurality of cavities 21 is prepared in Step 1.

The plurality of chips 50 and 51 having different thicknesses are embedded in the cavities 21 in Step 2.

The adhesive portion 60 is provided on the upper surfaces of the chips 51 having thicknesses smaller than that of the first CCL 20 in Step 3.

The adhesive portion 60 is formed of epoxy or attach film.

The second CCL 30 adheres to the chips 51, on which the adhesive portion 60 is provided, to allow the chips 51 to level with the first CCL 20 in Step 4.

The RCC 40 coated with the resin 41 is laminated on the upper surfaces of the first and second CCLs 20 and 30 in Step 5.

The first and second CCLs 20 and 30 and the RCC 40 are subject to a heat compression process in Step 6.

The second CCL 30 is formed with the plurality of first via holes 31 through which the heat of the chips 51 is discharged.

The RCC 40 is formed with the plurality of second via holes 42 to discharge the heat through the first via holes 31 to the outside and to perform the EMI shield function.

The embedded circuit board and the manufacturing method thereof according to the invention as described above are not limited to the previous embodiment and the drawings. While the invention has been shown and described with reference to certain embodiments thereof, it will be understood by those skilled in the art that various changes in form and details may be made therein without departing from the spirit and scope of the invention as defined by the appended claims.

What is claimed is:

1. A embedded circuit board comprising:
   a first copper clad laminate formed with a plurality of cavities with a plurality of chips having different thicknesses embedded in the plurality of cavities;
   a second copper clad laminate provided in the plurality of cavities to allow the first copper clad laminate to level with the plurality of chips; and
   a resin coated copper foil provided on upper surfaces of the first and second copper clad laminates.

2. The embedded circuit board of claim 1, further comprising an adhesive portion provided on upper surfaces of the chips such to adhere the chips to the second copper clad laminate.

3. The embedded circuit board of claim 2, wherein the adhesive portion is formed of epoxy or attach film.

4. The embedded circuit board of claim 1, wherein the second copper clad laminate is formed with a plurality of first via holes to discharge heat generated by the plurality of chips.

5. The embedded circuit board of claim 1, wherein the resin coated copper foil is formed with a plurality of second via holes to discharge the heat through first via holes and perform an EMI shield function.

6. The embedded circuit board of claim 5, wherein the second via holes include ground via holes.

7. The embedded circuit board of claim 1, wherein the resin coated copper foil is coated with resin and heat-compressed to the first and second copper clad laminates after a lamination process.

* * * * *